(12) United States Patent
Wang et al.

(10) Patent No.: US 11,474,133 B2
(45) Date of Patent: Oct. 18, 2022

(54) INSULATION IMPEDANCE DETECTION CIRCUIT AND INSULATION IMPEDANCE DETECTION METHOD OF PHOTOVOLTAIC INVERTER SYSTEM

(71) Applicant: Delta Electronics (Shanghai) Co., Ltd., Shanghai (CN)

(72) Inventors: Yuxi Wang, Shanghai (CN); Xuancai Zhu, Shanghai (CN); Weiyi Zheng, Shanghai (CN); Bingwen Weng, Shanghai (CN)

(73) Assignee: DELTA ELECTRONICS (SHANGHAI) CO., LTD, Shanghai (CN)

( * ) Notice: Subject to any disclaimer, the term of this patent is extended or adjusted under 35 U.S.C. 154(b) by 236 days.

(21) Appl. No.: 17/026,328

(22) Filed: Sep. 21, 2020

(65) Prior Publication Data
US 2021/0172987 A1 Jun. 10, 2021

(30) Foreign Application Priority Data
Dec. 6, 2019 (CN) .......................... 201911243655.0

(51) Int. Cl.
*G01R 27/02* (2006.01)
*G01R 27/18* (2006.01)
(Continued)

(52) U.S. Cl.
CPC .......... *G01R 27/025* (2013.01); *G01R 27/18* (2013.01); *H02J 3/381* (2013.01);
(Continued)

(58) Field of Classification Search
CPC ...... G01R 27/025; G01R 27/18; G01R 27/20; H02J 3/381; H02J 2300/26;
(Continued)

(56) References Cited

U.S. PATENT DOCUMENTS

| 2003/0048756 | A1* | 3/2003 | Chang | H04M 11/062 370/252 |
| 2004/0059396 | A1* | 3/2004 | Reinke | A61N 1/025 607/60 |

(Continued)

FOREIGN PATENT DOCUMENTS

| CN | 103063927 B | 10/2015 |
| CN | 105738706 A | 7/2016 |

(Continued)

*Primary Examiner* — Alvaro E Fortich
*Assistant Examiner* — Zannatul Ferdous
(74) *Attorney, Agent, or Firm* — CKC & Partners Co., LLC

(57) ABSTRACT

It is disclosed an insulation impedance detection circuit and detection method of a photovoltaic inverter system. The photovoltaic inverter system includes one or more input circuits and an inverter circuit, each of the input circuit electrically coupled to the inverter circuit through a positive bus and a negative bus, with a first equivalent impedance $R_p$ between the positive bus and a protective earth point and a second equivalent impedance $R_n$ between the negative bus and the protective earth point. The detection circuit includes: a bus voltage sampling circuit coupled to the positive bus and the negative bus for generating a first bus voltage and a second bus voltage; a protective earth voltage sampling circuit coupled to the protective earth point for generating a first protective earth voltage and a second protective earth voltage; and a controller for calculating an equivalent insulation impedance.

12 Claims, 6 Drawing Sheets

(51) Int. Cl.
*H02M 7/5387* (2007.01)
*H02J 3/38* (2006.01)
*H02S 50/10* (2014.01)
*H02S 40/32* (2014.01)

(52) U.S. Cl.
CPC ......... *H02M 7/53873* (2013.01); *H02S 40/32* (2014.12); *H02S 50/10* (2014.12); *H02J 2300/26* (2020.01)

(58) Field of Classification Search
CPC .. H02M 7/53873; H02M 1/007; H02M 3/156; H02M 7/53871; H02M 7/5395; H02S 40/32; H02S 50/10; Y02E 10/56
See application file for complete search history.

(56) References Cited

U.S. PATENT DOCUMENTS

2004/0122490 A1* 6/2004 Reinke ................... A61N 1/025
   607/60
2017/0302082 A1* 10/2017 Weng ...................... H02J 3/381

FOREIGN PATENT DOCUMENTS

| CN | 106997008 A | 8/2017 |
| CN | 107305224 A | 10/2017 |

* cited by examiner

INSULATION IMPEDANCE DETECTION CIRCUIT AND INSULATION IMPEDANCE DETECTION METHOD OF PHOTOVOLTAIC INVERTER SYSTEM

CROSS-REFERENCE TO RELATED APPLICATIONS

This non-provisional application claims priority under 35 U.S.C. § 119(a) on Patent Application No. 201911243655.0 filed in P.R. China on Dec. 6, 2019, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "Prior Art" to the present invention described herein. All references listed, cited and/or discussed in this specification are incorporated herein by reference in their entireties and to the same extent as if each reference was individually incorporated by reference.

BACKGROUND

1. Field of the Invention

The disclosure relates to a photovoltaic inverter system, and in particular, to an insulation impedance detection circuit and an insulation impedance detection method of a photovoltaic inverter system.

2. Related Art

In order to ensure personal safety, the degree of insulation of photovoltaic inverter should be judged before grid-connection, and when insulation impedance is smaller than a standard requirement, grid-connection is not allowed. Generally, the insulation impedance detection circuit consists of relays, switching tubes, diodes and resistors, which increase volume and cost of the photovoltaic inverter system.

Chinese patent application published under CN201610243810 discloses an insulation impedance detection circuit and detection method of a photovoltaic inverter, which may detect the insulation impedance by switching two groups of switches and detection resistors, and are applicable to the multiple input circuit.

Chinese patent application published under CN201610240480 discloses a method and apparatus for detecting an insulation resistance of a dual-input photovoltaic inverter, which also detects insulation resistance by switching two groups of switches and detection resistors. The influence of string input voltages on detection precision has been analyzed, and two controllable short-circuit branches are added.

Therefore, there is an urgent demand for a simpler insulation impedance detection circuit to further reduce volume and cost of the photovoltaic inverter system.

SUMMARY

The disclosure provides an insulation impedance detection circuit and an insulation impedance detection method of a photovoltaic inverter system, which can reduce volume and cost of the insulation detection circuit, while ensuring safe operation of the photovoltaic inverter system and assuring detection precision of insulation impedance According to an aspect of the present disclosure, there's provided an insulation impedance detection circuit of a photovoltaic inverter system, the photovoltaic inverter system includes one or more input circuits and an inverter circuit, each of the input circuits electrically coupled to the inverter circuit through a positive bus and a negative bus, with a first equivalent impedance $R_p$ between the positive bus and a protective earth point, and a second equivalent impedance $R_n$ between the negative bus and the protective earth point, wherein the insulation impedance detection circuit including:

a bus voltage sampling circuit coupled to the positive bus and the negative bus for sampling the bus voltage and generating a first bus voltage and a second bus voltage;

a protective earth voltage sampling circuit coupled to the protective earth point for sampling the protective earth voltage and generating a first protective earth voltage and a second protective earth voltage corresponding to the first bus voltage and the second bus voltage, respectively; and a controller coupled to the bus voltage sampling circuit and the protective earth voltage sampling circuit for calculating an equivalent insulation impedance of the photovoltaic inverter system according to the first bus voltage, the second bus voltage, the first protective earth voltage and the second protective earth voltage, and for controlling interconnection between the inverter circuit and a power grid when the equivalent insulation impedance is larger than or equal to a threshold value.

According to another aspect of the present disclosure, there's provided an insulation impedance detection method of a photovoltaic inverter system, the photovoltaic inverter system includes one or more input circuits and an inverter circuit, each of the input circuits electrically coupled to the inverter circuit through a positive bus and a negative bus, with a first equivalent impedance $R_p$ between the positive bus and a protective earth point and a second equivalent impedance $R_n$ between the negative bus and the protective earth point, wherein the insulation impedance detection method including:

sampling a bus voltage by coupling a bus voltage sampling circuit to the positive bus and the negative bus and generating a first bus voltage and a second bus voltage;

sampling a protective earth voltage by coupling a protective earth voltage sampling circuit to the protective earth point and generating a first protective earth voltage and a second protective earth voltage corresponding to the first bus voltage and the second bus voltage, respectively; and calculating an equivalent insulation impedance of the photovoltaic inverter system according to the first bus voltage, the second bus voltage, the first protective earth voltage and the second protective earth voltage, and controlling interconnection between the inverter circuit and a power grid by a controller when the equivalent insulation impedance is larger than or equal to a threshold value.

BRIEF DESCRIPTION OF THE DRAWINGS

The exemplary embodiments of the disclosure will be described in detail with reference to the accompanying drawings, through which the above and other objects, features and advantages of the disclosure will become more apparent.

DETAILED DESCRIPTION

Figure 1:
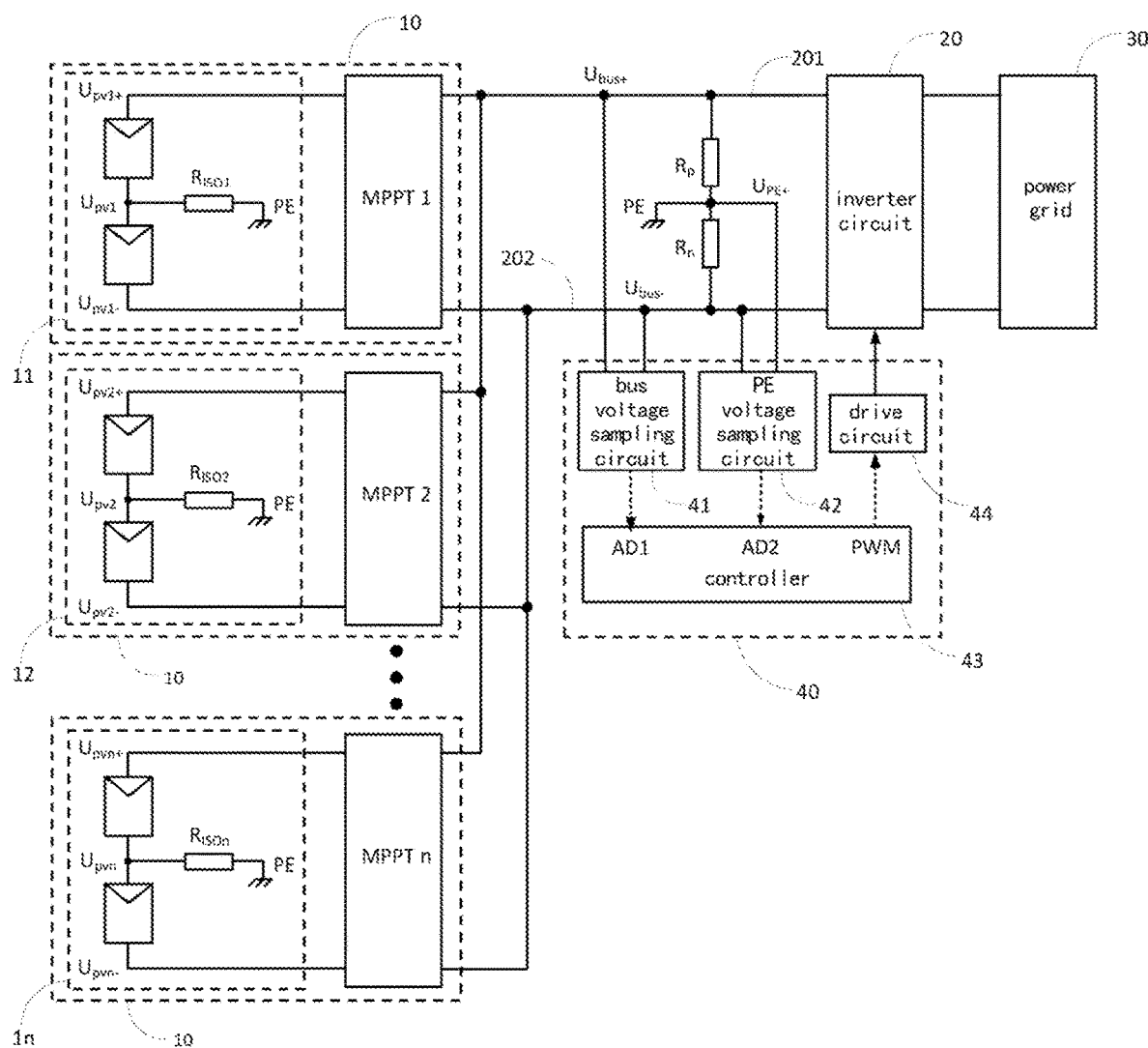
FIG. 1 is a structural diagram of an insulation impedance detection circuit according to one preferable embodiment of the disclosure.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this disclosure will be thorough and complete, and the conception of exemplary embodiments will be fully conveyed to those skilled in the art. In the drawings, the same reference numeral denotes the same or similar structure, so their detailed description will be omitted.

When factors/components/the like described and/or illustrated here are introduced, the phrases "one", "a(an)", "the", "said" and "at least one" refer to one or more factors/components/the like. The terms "include", "comprise" and "have" refer to an open and included meaning, and refer to additional factors/components/the like, in addition to the listed factors/components/the like. Moreover, the terms "first", "second" and the like in the claims are only used as signs, instead of numeral limitations to objects.

FIG. 1 is a structural diagram of an insulation impedance detection circuit of a photovoltaic inverter system according to one preferable embodiment of the disclosure. As shown in FIG. 1, the photovoltaic inverter system 100 includes at least one input circuit 10 and an inverter circuit 20. Each of the input circuits 10 is electrically coupled to the inverter circuit 20 through a positive bus 201 and a negative bus 202. There is a first equivalent impedance $R_p$ between the positive bus 201 and a protective earth point PE, and there is a second equivalent impedance $R_n$ between the negative bus 202 and the protective earth point PE. An output end of the inverter circuit 20 is connected to a power grid 30.

The insulation impedance detection circuit 40 of the photovoltaic inverter system 100 mainly includes a bus voltage sampling circuit 41, a protective earth voltage sampling circuit (i.e., a PE voltage sampling circuit) 42 and a controller 43. The bus voltage sampling circuit 41 is coupled to the positive bus 201 and the negative bus 202, and is used for sampling the bus voltages and generating a first bus voltage and a second bus voltage, where the first bus voltage is different from the second bus voltage. The protective earth voltage sampling circuit (i.e., a PE voltage sampling circuit) 42 is coupled to the protective earth point PE, and is used for generating a first protective earth voltage and a second protective earth voltage corresponding to the first bus voltage and the second bus voltage, respectively. The controller 43 is coupled to the bus voltage sampling circuit 41 and the PE voltage sampling circuit 42, and is used for calculating an equivalent insulation impedance $R_{ISO}$ of the photovoltaic inverter system 100 according to the first bus voltage, the second bus voltage, the first protective earth voltage and the second protective earth voltage. And the controller 43 may control the interconnection between the inverter circuit 20 and a power grid 30 when the equivalent insulation impedance $R_{ISO}$ is larger than or equal to a threshold value, where $R_{ISO}$ is a parallel impedance value of the equivalent insulation impedances of multiple input strings.

In the embodiment shown in FIG. 1, the input circuits 10, for example, may be multiple input circuits, include but not limited to a number n of input circuits 11, 12 . . . , and 1n, and are coupled to the positive bus 201 and the negative bus 202 in parallel. Each of the input circuits 11, 12 . . . , and 1n includes a string formed by connecting a plurality of photovoltaic panels in series, each string having positive and negative ends. For example, the 1st string has a positive end $U_{pv1+}$ and a negative end $U_{pv1-}$. Moreover, $R_{ISO_x}$ (x= 1, 2, . . . n) is an equivalent insulation impedance of the nth string with respect to the ground, and $U_{pvx}$ (x=1, 2, . . . n) is a voltage of the equivalent insulation impedance $R_{ISO_x}$ (x=1, 2, . . . n) of the nth string with respect to the protective earth end PE, with a minimum of 0V and a maximum of a string input voltage $U_{pvn+}$.

In some embodiments of the disclosure, each of the input circuits 10 further includes a Maximum Power Point Tracking (MPPT) circuit MPPT 1, MPPT 2 . . . , or MPPT n. It shall be understood that a circuit topology of the MPPT circuit may be a Boost circuit, or other circuits capable of achieving MPPT functions. A circuit topology of the inverter circuit 20 may be a full bridge circuit or other topologies. The disclosure is not limited thereto.

In some embodiments of the disclosure, the insulation impedance detection circuit 40 may further include a Pulse Width Modulation (PWM) drive circuit 44 coupled between the controller 43 and the inverter circuit 20 for generating a PWM signal, where the PWM signal is used for driving and controlling the inverter circuit 20.

In the embodiment shown in FIG. 1, the different bus voltages can be obtained by sampling the bus voltage of the inverter circuit when it does not operate and the bus voltage when it operates, or by sampling the corresponding bus voltages in two operating modes, and then the controller 43 may calculate the equivalent insulation impedance $R_{ISO}$ according to the different bus voltages and the protective earth voltages (i.e., PE voltages) sampled by the PE voltage sampling circuit 42 corresponding to different bus voltages.

Figure 2A:
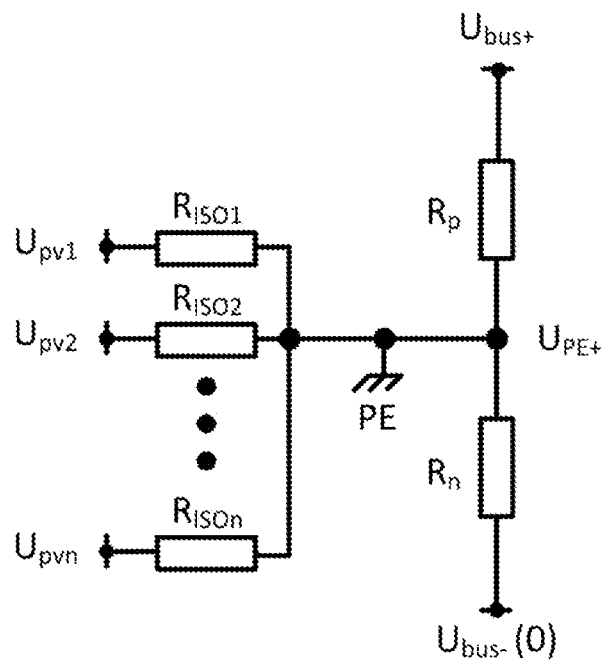
FIG. 2A is an equivalent circuit of the insulation impedance detection circuit when a bus voltage is $U_{bus+}$ shown in FIG. 1.
Figure 2B:
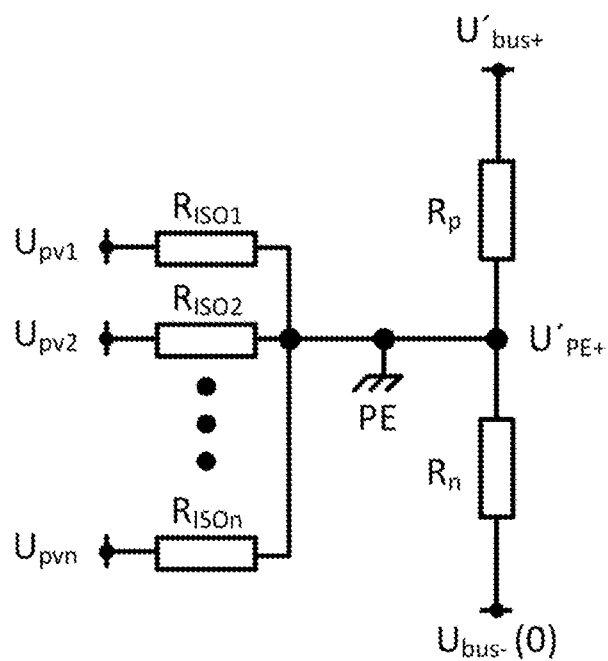
FIG. 2B is an equivalent circuit of the insulation impedance detection circuit when a bus voltage is $U'_{bus+}$ shown in FIG. 1.

The specific operating principle of the disclosure is shown in FIG. 2, where FIG. 2A is an equivalent circuit for insulation impedance detection when a bus voltage is $U_{bus+}$ shown in FIG. 1, and FIG. 2B is an equivalent circuit for insulation impedance detection when a bus voltage is $U'_{bus+}$ shown in FIG. 1. As shown in the drawings, the two bus voltages ($U_{bus+}$ and $U'_{bus+}$) can be the maximum string input voltage and the bus voltage when the inverter is operating, or the bus voltages in two operating modes of the inverter. A voltage value at the PE point in FIG. 2A is $U_{PE}$, a voltage value at the PE point in FIG. 2B is $U'_{PE}$, and taking the negative bus voltage $U_{bus-}$ as a reference potential point, an equation set can be built according to FIGS. 2A and 2B:

$$\frac{U_{pv1} - U_{PE}}{R_{ISO1}} + \frac{U_{pv2} - U_{PE}}{R_{ISO2}} + \ldots + \frac{U_{pvn} - U_{PE}}{R_{ISOn}} + \frac{U_{bus+} - U_{PE}}{R_p} = \frac{U_{PE}}{R_n} \quad (1)$$

$$\frac{U_{pv1} - U'_{PE}}{R_{ISO1}} + \frac{U_{pv2} - U'_{PE}}{R_{ISO2}} + \ldots + \frac{U_{pvn} - U'_{PE}}{R_{ISOn}} + \frac{U_{bus+} - U'_{PE}}{R_p} = \frac{U'_{PE}}{R_n} \quad (2)$$

Meanwhile, define the equivalent insulation impedance $R_{ISO}$ of the photovoltaic inverter system as a parallel value of the equivalent insulation impedance of multiple input strings, shown in formula (3), $$\frac{1}{R_{ISO}} = \frac{1}{R_{ISO1}} + \frac{1}{R_{ISO2}} + \ldots + \frac{1}{R_{ISOn}} \quad (3)$$

Combining formulas (1), (2) and (3), the equivalent insulation impedance $R_{ISO}$ of the photovoltaic inverter system can be solved as in formula (4), $$R_{ISO} = \frac{(U_{PE} - U'_{PE}) \cdot R_p}{(U_{bus+} - U'_{bus+}) - (U_{PE} - U'_{PE}) \cdot \left(1 + \frac{R_p}{R_n}\right)} \quad (4)$$

wherein $R_p$ and $R_n$ are equivalent impedance of the positive bus and the negative bus of the photovoltaic inverter system with respect to the protective earth point (i.e., PE point), respectively, and are known quantities. The equivalent insulation impedance $R_{ISO}$ of the photovoltaic inverter system can be calculated according to formula (4) based on the voltage values of the two equivalent circuits in FIGS. 2A and 2B.

Figure 3:
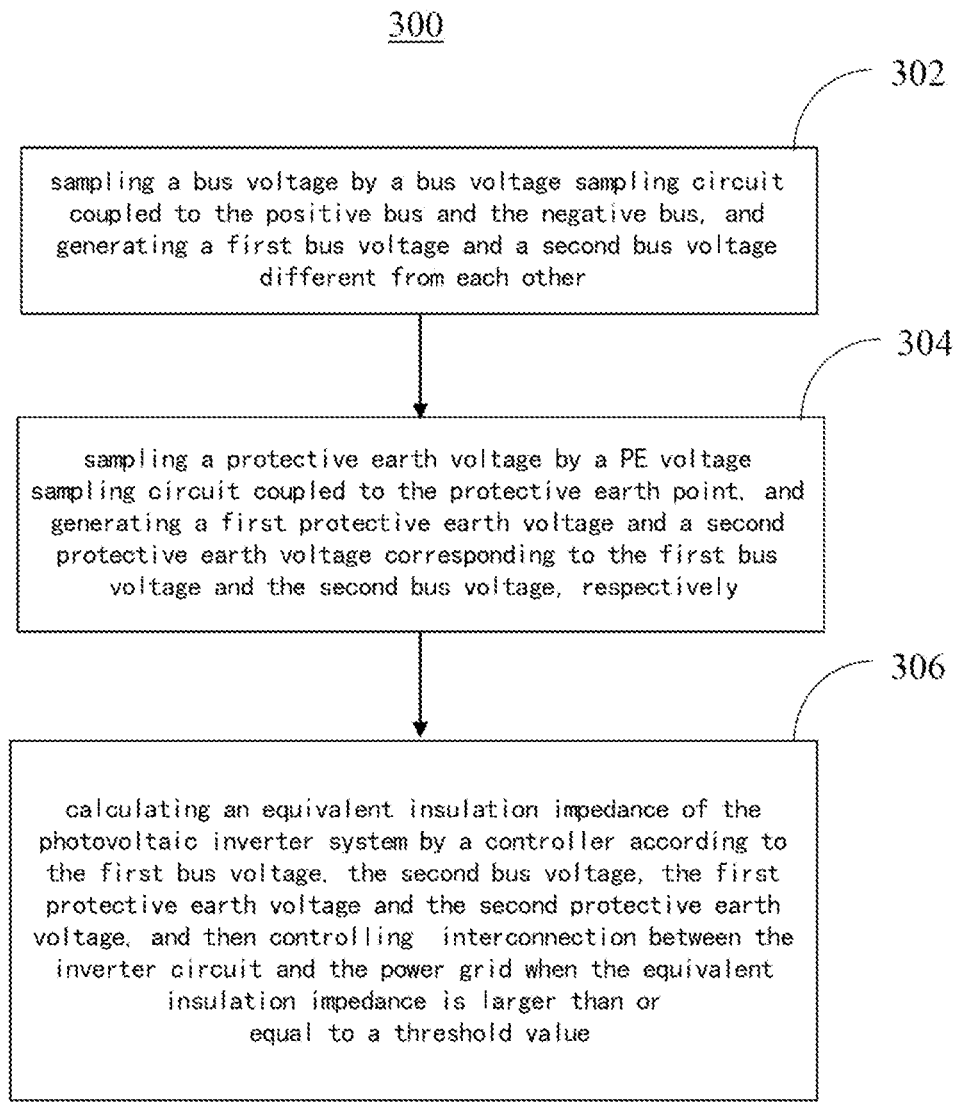
FIG. 3 is a schematic diagram of an insulation impedance detection method according to one preferable embodiment of the disclosure.

FIG. 3 illustrates an insulation impedance detection method 300 according to one preferable embodiment of the disclosure, which mainly includes:

Step 302, sampling the bus voltage by the bus voltage sampling circuit 41 coupled to the positive bus 201 and the negative bus 202, and generating a first bus voltage (such as, $U_{bus+}$) and a second bus voltage (such as, $U'_{bus+}$), where the first bus voltage may be different from the second bus voltage;

Step 304, sampling the protective earth voltage by the PE voltage sampling circuit 42 coupled to the protective earth point PE, and generating a first protective earth voltage (such as, $U_{PE}$) and a second protective earth voltage (such as, $U'_{PE}$) corresponding to the first bus voltage (such as, $U_{bus+}$) and the second bus voltage (such as, $U'_{bus+}$), respectively; and Step 306, calculating an equivalent insulation impedance $R_{ISO}$ (such as, calculated according to formula (4)) of the photovoltaic inverter system by the controller 43 according to the first bus voltage (such as, $U_{bus+}$), the second bus voltage (such as, $U'_{bus+}$), the first protective earth voltage (such as, $U_{PE}$) and the second protective earth voltage (such as, $U'_{PE}$), and then controlling interconnection between the inverter circuit 20 and the power grid 30 when the equivalent insulation impedance is larger than or equal to a threshold value.

Figure 4:
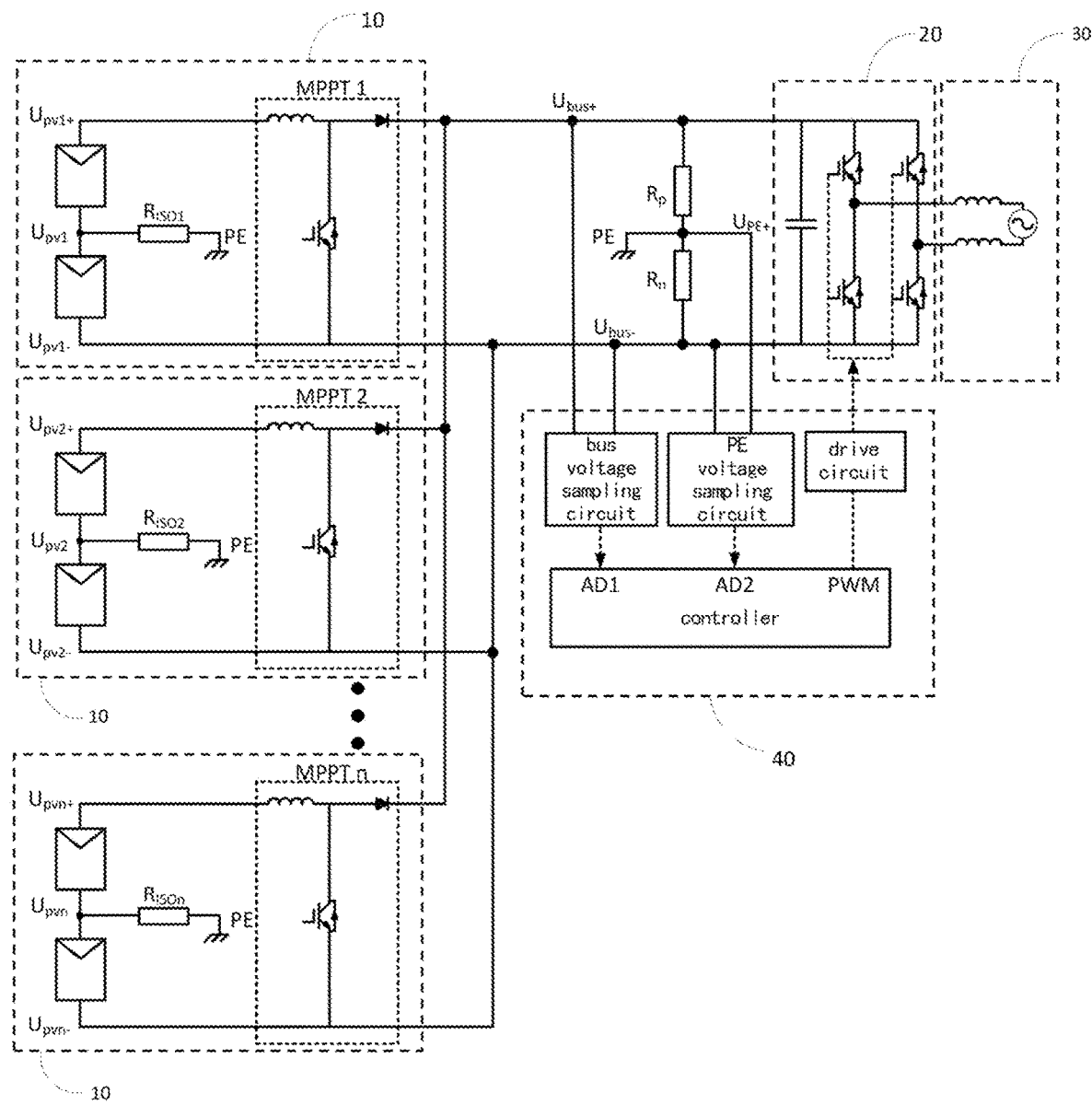
FIG. 4 is a circuit diagram when the insulation impedance detection circuit and detection method of the disclosure are applied to a single-phase photovoltaic inverter with multiple input strings.
Figure 5:
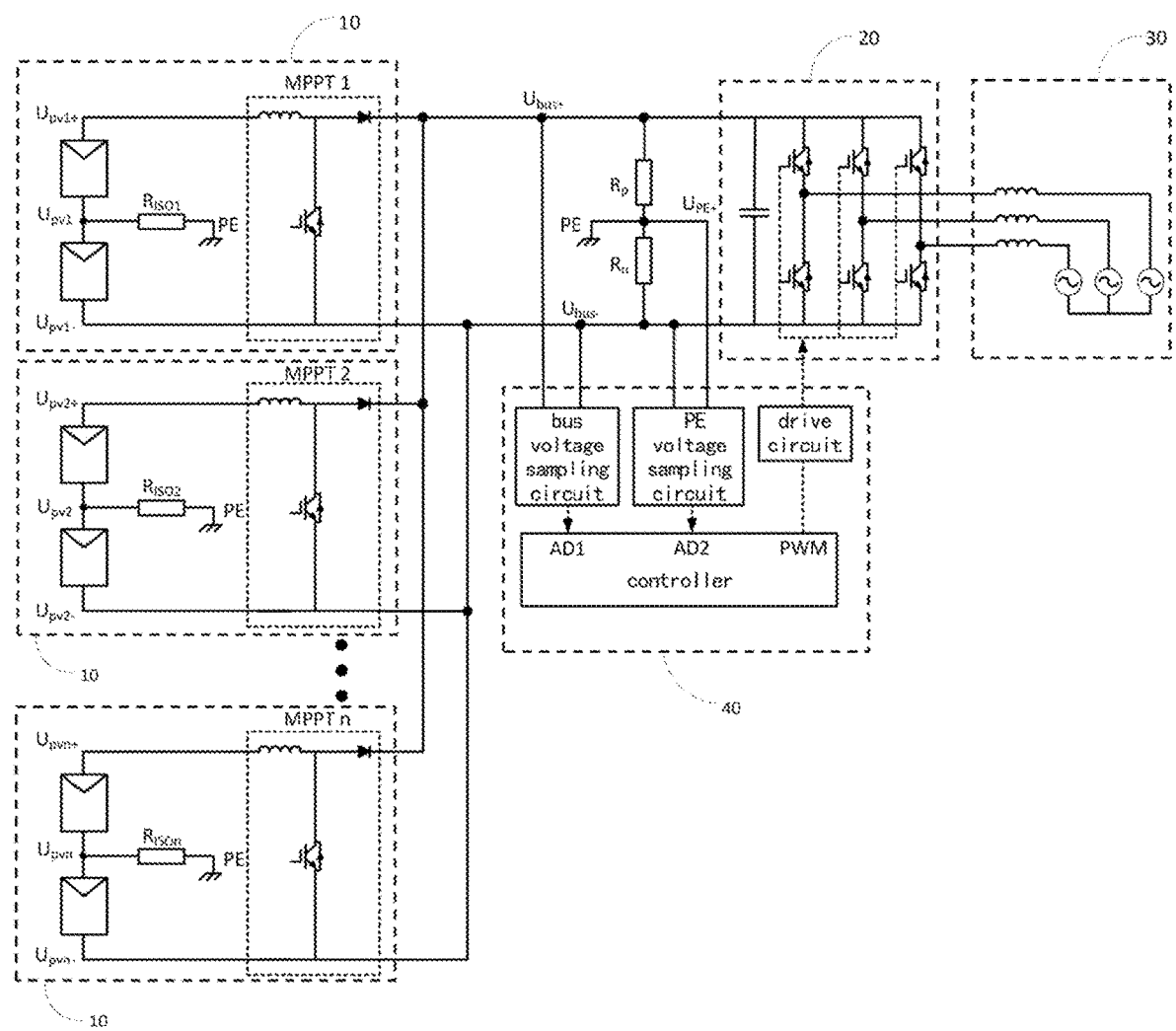
FIG. 5 is a circuit diagram when the insulation impedance detection circuit and detection method of the disclosure are applied to a three-phase photovoltaic inverter with multiple input strings.

The insulation impedance detection circuit and detection method of the disclosure may be applied to a single-phase inverter circuit or a multiphase inverter circuit. That is, the inverter circuit 20 in FIG. 1 may be a single-phase inverter circuit or a multiphase inverter circuit. FIG. 4 illustrates a circuit diagram when the insulation impedance detection circuit and detection method of the disclosure are applied to a single-phase photovoltaic inverter with multiple input strings, wherein the power grid 30 is a single-phase power grid. FIG. 5 illustrates a circuit diagram when the insulation impedance detection circuit and detection method of the disclosure are applied to a three-phase photovoltaic inverter with multi-string inputs, wherein the power grid 30 is a three-phase power grid. Moreover, in the embodiments shown in FIGS. 4 and 5, the circuit topology of the circuits MPPT 1 to MPPT n is a Boost circuit, and the circuit topology of the inverter circuit 20 is a bridge circuit. But it shall be understood that the disclosure is not limited thereto. In other words, the insulation impedance detection circuit and detection method of the disclosure are irrelevant to the topology of the inverter circuit of the photovoltaic inverter system, and applicable to all topologies, and can also be applied to photovoltaic inverter system with strings inputs of any number, wherein the calculation formula of the equivalent insulation impedance $R_{ISO}$ can be unified into formula (4).

Figure 6:
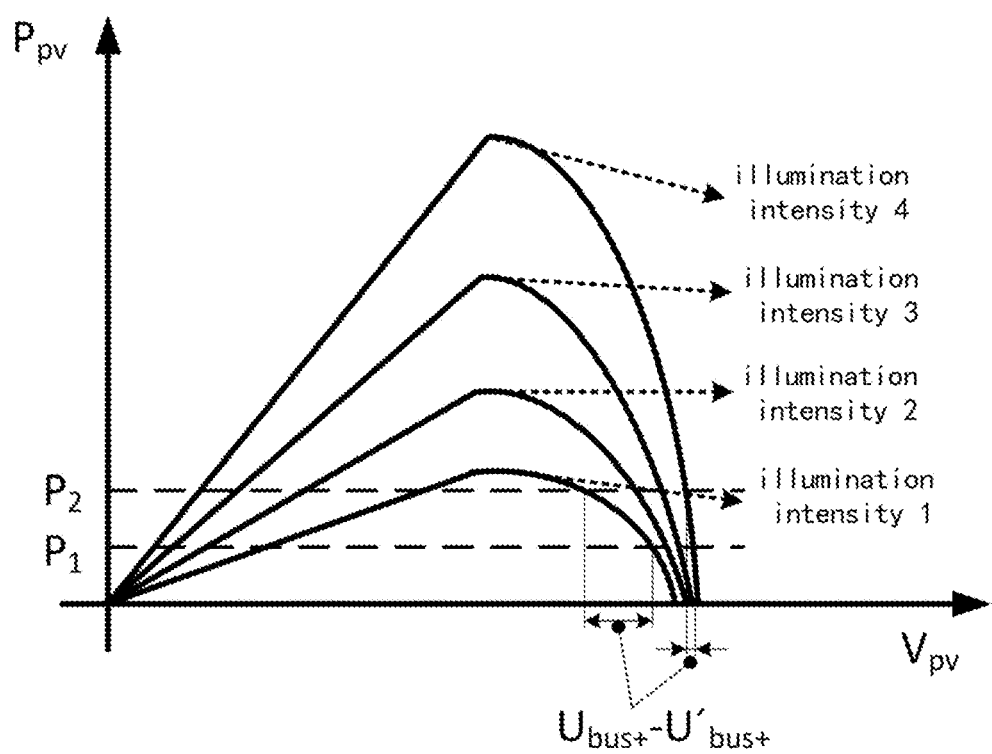
FIG. 6 is a schematic diagram of input power curves of strings under different illuminations and bus voltage operating points controlled by the disclosure.

In other embodiments, the controller 43 may also be configured to regulate the PWM drive circuit according to different illumination intensities, wherein the controller increases a voltage difference correspondingly between the first bus voltage and the second bus voltage when the illumination intensity is larger than a threshold value of the illumination intensity. FIG. 6 is a schematic diagram of input power curves of strings under different illuminations and stable operating points controlled by the bus voltage of the disclosure. FIG. 6 shows PV curves of strings under four illumination intensities, wherein an illumination intensity 1 is less than an illumination intensity 2, the illumination intensity 2 is less than an illumination intensity 3, and the illumination intensity 3 is less than an illumination intensity 4. The inverter is driven and controlled by the PWM signal, such that the inverter operates in two modes, wherein overall power consumptions of the photovoltaic inverter are $P_1$ and $P_2$, respectively, and a bus voltage difference ($U_{bus+}$–$U'_{bus+}$) under the illumination intensity 1 is larger than a bus voltage difference ($U_{bus+}$–$U'_{bus+}$) under the illumination intensity 4. Therefore, when the illumination intensity is high, the detection precision of the insulation impedance is poorer than that when the illumination intensity is low. In order to improve the detection precision of the insulation impedance when the illumination intensity is high, a difference of the overall power consumptions of the photovoltaic inverter between two detections can be increased by regulating the PWM control signal of the inverter, and then adjusting, for example, a voltage modulation ratio of the inverter circuit or an operating frequency of the inverter circuit, thereby improving the detected bus voltage difference ($U_{bus+}$–$U'_{bus+}$), and ensuring the detection precision of the insulation impedance.

The insulation impedance detection circuit and detection method of the disclosure has the following advantages:

1. Volume and cost of the photovoltaic inverter system are reduced without additional switches and corresponding drive circuits;

2. Be applicable to insulation impedance detection of the photovoltaic inverter system with multiple input strings, and the detection method, detection time and detection precision are not influenced by the number of input strings, which results in a better universality;

3. The bus voltage is changed by controlling the inverter circuit to operate in different modes, and an equation set is built to solve for the insulation impedance by two groups of detection values. The method is applicable within a full input voltage range, while having a better safety;

4. The bus voltage can be regulated within a relatively broad range through the control of a voltage modulation ratio or a switching frequency of the inverter circuit to ensure detection precision of the insulation impedance.

Exemplary embodiments of the disclosure have been shown and described above. It shall be understood that the disclosure is not limited to the disclosed embodiments. Instead, the disclosure intends to cover various modifications and equivalent setting included in the spirit and scope of the appended claims.

What is claimed is:

1. An insulation impedance detection circuit of a photovoltaic inverter system, the photovoltaic inverter system comprises one or more input circuits and an inverter circuit, each of the input circuits electrically coupled to the inverter circuit through a positive bus and a negative bus, with a first equivalent impedance $R_p$ between the positive bus and a protective earth point, and a second equivalent impedance $R_n$ between the negative bus and the protective earth point, wherein the insulation impedance detection circuit comprising:
 a bus voltage sampling circuit coupled to the positive bus and the negative bus for sampling the bus voltage and generating a first bus voltage and a second bus voltage;
 a protective earth voltage sampling circuit coupled to the protective earth point for sampling the protective earth voltage and generating a first protective earth voltage and a second protective earth voltage corresponding to the first bus voltage and the second bus voltage, respectively; and
 a controller coupled to the bus voltage sampling circuit and the protective earth voltage sampling circuit for calculating an equivalent insulation impedance of the photovoltaic inverter system according to the first bus voltage, the second bus voltage, the first protective earth voltage and the second protective earth voltage, and controlling interconnection between the inverter circuit and a power grid when the equivalent insulation impedance is larger than or equal to a threshold value.

2. The insulation impedance detection circuit according to claim 1, wherein the photovoltaic inverter system comprises multiple the input circuits coupled to the positive bus and the negative bus in parallel.

3. The insulation impedance detection circuit according to claim 1, further comprising:
 a Pulse Width Modulation (PWM) drive circuit coupled between the controller and the inverter circuit for generating a PWM signal, and the PWM signal is used for driving and controlling the inverter circuit.

4. The insulation impedance detection circuit according to claim 3, wherein the controller is further configured to regulate the PWM drive circuit according to different illumination intensities, wherein the controller increases a voltage difference between the first bus voltage and the second bus voltage when the illumination intensity is larger than a threshold value of the illumination intensity.

5. The insulation impedance detection circuit according to claim 1, wherein the inverter circuit is a single-phase inverter circuit or a multiphase inverter circuit.

6. The insulation impedance detection circuit according to claim 1, wherein each of the input circuits has a Maximum Power Point Tracking circuit, respectively.

7. An insulation impedance detection method of a photovoltaic inverter system, the photovoltaic inverter system comprises one or more input circuits and an inverter circuit, each of the input circuits electrically coupled to the inverter circuit through a positive bus and a negative bus, with a first equivalent impedance $R_p$ between the positive bus and a protective earth point and a second equivalent impedance $R_n$ between the negative bus and the protective earth point, wherein the insulation impedance detection method comprising:
 sampling a bus voltage by coupling a bus voltage sampling circuit to the positive bus and the negative bus, and generating a first bus voltage and a second bus voltage;
 sampling a protective earth voltage by coupling a protective earth voltage sampling circuit to the protective earth point, and generating a first protective earth voltage and a second protective earth voltage corresponding to the first bus voltage and the second bus voltage, respectively; and
 calculating an equivalent insulation impedance of the photovoltaic inverter system according to the first bus voltage, the second bus voltage, the first protective earth voltage and the second protective earth voltage, and controlling interconnection between the inverter circuit and a power grid by a controller when the equivalent insulation impedance is larger than or equal to a threshold value.

8. The insulation impedance detection method according to claim 7, wherein the photovoltaic inverter system comprises multiple input circuits coupled to the positive bus and the negative bus in parallel, and the equivalent insulation impedance of the photovoltaic inverter system is a parallel impedance value of respective equivalent insulation impedance of the multiple input circuits.

9. The insulation impedance detection method according to claim 7, wherein the inverter circuit is driven and controlled by a Pulse Width Modulation (PWM) signal generated by a PWM drive circuit coupled between the controller and the inverter circuit.

10. The insulation impedance detection method according to claim 9, further comprising:
 regulating the PWM drive circuit by the controller according to different illumination intensities, wherein the controller increases a voltage difference between the first bus voltage and the second bus voltage when the illumination intensity is larger than a threshold value of the illumination intensity.

11. The insulation impedance detection method according to claim 9, wherein the controller regulates the PWM drive circuit by adjusting a voltage modulation ratio of the inverter circuit, or adjusting a switching frequency of the inverter circuit.

12. The insulation impedance detection method according to claim 7, wherein each of the input circuits has a Maximum Power Point Tracking circuit, respectively.

* * * * *